(12) United States Patent
Solal et al.

(10) Patent No.: US 7,126,251 B2
(45) Date of Patent: Oct. 24, 2006

(54) INTERFACE ACOUSTIC WAVE DEVICE MADE OF LITHIUM TANTALATE

(75) Inventors: Marc Solal, Nice (FR); Serge Calisti, Marseilles (FR); Vincent Laude, Villemoisson sur Orge (FR); Sylvain Ballandras, Avanne-Aveney (FR); Serge Camou, Tokyo (JP); Thomas Pastureaud, Mougins-le-Haut (FR)

(73) Assignee: Thales, Neuilly-sur-Seine (FR)

( * ) Notice: Subject to any disclaimer, the term of this patent is extended or adjusted under 35 U.S.C. 154(b) by 100 days.

(21) Appl. No.: 10/507,909

(22) PCT Filed: Mar. 11, 2003

(86) PCT No.: PCT/FR03/00779

§ 371 (c)(1),
(2), (4) Date: Sep. 16, 2004

(87) PCT Pub. No.: WO03/098800

PCT Pub. Date: Nov. 27, 2003

(65) Prior Publication Data

US 2005/0162048 A1    Jul. 28, 2005

(30) Foreign Application Priority Data

Mar. 19, 2002   (FR) .................... 02 03385

(51) Int. Cl.
*H03H 9/25*   (2006.01)
*H03H 9/64*   (2006.01)
(52) U.S. Cl. .................. 310/313 R; 310/313 B; 310/358; 310/359; 333/193; 333/194; 333/195
(58) Field of Classification Search ............. 310/313, 310/358–360; 333/193–195
See application file for complete search history.

(56) References Cited

U.S. PATENT DOCUMENTS

| | | | | |
|---|---|---|---|---|
| 5,020,034 A | | 5/1991 | Solal et al. ................. 367/138 |
| 5,081,389 A | * | 1/1992 | Abbott et al. ........... 310/313 A |
| 5,369,327 A | * | 11/1994 | Wallnofer et al. ...... 310/313 A |
| 5,434,465 A | * | 7/1995 | Sato et al. ............. 310/313 A |
| 5,475,348 A | | 12/1995 | Hode et al. ................. 333/195 |
| 5,703,427 A | | 12/1997 | Solal et al. ............. 310/313 D |
| 5,936,487 A | | 8/1999 | Solal et al. ................. 333/193 |

(Continued)

FOREIGN PATENT DOCUMENTS

FR    2145750 A    2/1973

(Continued)

*Primary Examiner*—Darren Schuberg
*Assistant Examiner*—J. Aguirrechea
(74) *Attorney, Agent, or Firm*—Lowe Hauptman & Berner, LLP

(57) ABSTRACT

The invention relates to interfaces acoutics wave components made of lithium tantalate. Two substrate make up the filter have the same cut and the same crystal orientation, the invention gives the best cut angles in particular for optimizing the electromechanical coupling coefficient that determines the final performance characteristics of the component produced. Curves giving the variations of the coupling coefficient an the attenuation as a function of the cut angles and of the direction of propagation are provided. The values of the main acoustic characteristics of the component for these optimum cut angles are also given. The application of this type of device are, on the on hand, uses as a passive component such a resonator or a filter or a delay line, or as an integrated device, either in a measurement chain or in any array of devices operating according to the principle of recognition of the device by a phase code.

8 Claims, 6 Drawing Sheets

U.S. PATENT DOCUMENTS

| | | | |
|---|---|---|---|
| 6,011,344 A | 1/2000 | Dufilie et al. | 310/313 B |
| 6,043,726 A | 3/2000 | Solal et al. | 333/195 |
| 6,044,533 A | 4/2000 | Bureau et al. | 29/25.35 |
| 6,054,794 A * | 4/2000 | Naumenko et al. | 310/313 A |
| 6,316,861 B1 | 11/2001 | Ballandras et al. | 310/313 B |
| 6,344,705 B1 | 2/2002 | Solal et al. | 310/313 B |
| 6,674,215 B1 * | 1/2004 | Yoshida et al. | 310/313 R |
| 6,838,807 B1 * | 1/2005 | Ozaki et al. | 310/313 D |
| 2002/0017828 A1 * | 2/2002 | Roesler | 310/313 A |
| 2003/0137367 A1 * | 7/2003 | Kadota | 333/195 |

FOREIGN PATENT DOCUMENTS

| | | | |
|---|---|---|---|
| FR | 2799906 A | | 4/2001 |
| JP | 57181220 A | * | 11/1982 |
| JP | 59182617 A | * | 10/1984 |
| JP | 10335974 | | 3/1999 |

* cited by examiner

INTERFACE ACOUSTIC WAVE DEVICE MADE OF LITHIUM TANTALATE

CROSS-REFERENCE TO RELATED APPLICATION

The present application is based on International Application No. PT/FR03/00779, filed Mar. 11, 2003, entitled "INTERFACE ACOUSTIC WAVE DEVICE MADE OF LITHIUM TANTALATE", which in turn corresponds to French Application No. FR 02 03385, filed Mar. 19, 2002, and priority is hereby claimed under 35 USC 119 based on these applications. Each of these applications is hereby incorporated by reference herein in their entirety into this application.

FIELD OF THE INVENTION

The field of the invention is that of interface acoustic wave devices and especially that of filters, produced at the interface between two lithium tantalate substrates.

BACKGROUND OF THE INVENTION

It is known to produce surface acoustic wave devices that use the propagation of waves on the surface of a piezoelectric substrate. In the case of what are called Rayleigh waves, these are generated and received by interdigitated comb transducers composed of interlaced electrodes between which a potential difference is imposed. These devices have two main drawbacks.

Firstly, in order for the surface waves to propagate correctly on the surface of the substrate, this surface must remain free. This condition is obtained by encapsulation technologies for obtaining a cavity.

Secondly, the pitch of the electrodes making up the interdigitated combs is often small, of the order of a few hundred nanometers. In addition, conducting particles of very small dimensions present inside the package may short-circuit a transducer and disturb the normal operation of the device. To alleviate this drawback, it is necessary either to make the packages for the components hermetically sealed, or to deposit a thin layer of insulating dielectric material on the transducers. This operation, called passivation, makes it possible to eliminate sensitivity to conducting particles. However, passivation does not make it possible to dispense with the encapsulation operation, which is an operation expensive to carry out.

The use of interface acoustic wave devices allows the various problems associated with encapsulation to be solved. In this case, use is no longer made of the propagation of the acoustic waves on the surface of the substrate, but at the interface between two substrates instead. Of course, this device makes it possible to obtain a passivated component no longer requiring a cavity to be produced. Moreover, the package may be completely eliminated.

In 1924, Stoneley demonstrated the possibility of guiding an acoustic wave at the interface between two materials [Proc. Roy. Soc. London A 106, 416]. These waves were regarded as being polarized in the sagittal plane.

In 1971, Maerfeld and Tournois demonstrated the existence of horizontal shear waves propagating at the surface between two materials. The piezoelectric case was considered [C. Maerfeld and P. Tournois, Appl. Phys. Lett. 19, 117, 1971]. The first use of this type of wave for acoustic components is disclosed in patent FR 2 145 750. The invention described uses the propagation of pure shear waves at the interface between two materials, at least one of which is piezoelectric. The case in which the two materials are identical is considered. However, the above patent makes no mention of transducers placed at the interface between the two materials.

In 1983, the propagation of waves at the interface between a piezoelectric material and an isotropic material, for the purpose of producing packageless SAW (surface acoustic wave) devices is described, which implicitly assumes that the transducers are placed at the interface. The coupling coefficient was also studied [Shimitzu et al., "Stoneley waves propagating along an interface between piezoelectric material and isotropic material", 1983 IEEE U.S. Proc. pp 373–375].

More recently, in 1998, a different combination of materials was examined for the purpose of filtering [M. Yamaguchi, T. Yamashita, K. Hashimoto and T. Omori, "Highly piezoelectric waves in Si/SiO$_2$/LiNbO$_3$ and Si/SiO$_2$/LiNbO$_3$ structures" (unpublished)].

Finally, in 1999, patent FR 2 799 906 describes filters using transducers at the interface between two identical piezoelectric materials.

In general, an interface acoustic wave device consists of two substrates denoted by $S_1$ and $S_2$, at least one of which is piezoelectric, and of an interface region I lying between these two substrates, as indicated in FIG. 1. In the general case, the interface region I is a structure that comprises at least the electro-acoustic transducers E. Electrical interconnections coupled to said devices allow signals to be emitted and transmitted.

The interface waves can be used to produce passive components. In general, any type of device obtained using waves propagating on the surface of a crystal can be produced using interface waves. In particular, it is possible to reflect the interface waves using arrays of metal electrodes with a period equal to a half-wavelength placed at the interface. Thus, firstly a resonator is produced, by placing an interdigitated transducer between two reflector arrays, and secondly a filter, by coupling resonators together via electrical or acoustic means. The directivity of a transducer is improved by interspersing reflectors therein. All applications of surface wave components are therefore accessible, especially delay lines, band filters, resonators and dispersive filters. Applications of these components as measurement sensors are also possible.

Phase code devices have specific transducers characterized by a distribution of the electrodes such that it is known how to associate one particular code with a given phase code component. Remotely interrogable devices using radio waves employ this principle. The operation is as follows: a phase code is used at emission of the wave, and the wave is picked up by an antenna connected to the input of the phase-code component; conventionally, the transducer converts the signal into a mechanical wave. Said wave propagates as far as the output transducer where it is then reconverted into an electrical signal and re-emitted. The received signal is analyzed and the component that has received and transformed the signal is thus identified.

Interface wave devices can be used as remotely interrogable devices, especially for measurement applications, such as for the measurement of pressure, temperature or acceleration.

The choice of structures for the interface wave components may vary very greatly. In particular, the following combinations may be mentioned:

the substrate $S_1$ is piezoelectric and $S_2$ is not. In this case, $S_2$ is chosen according to its mechanical properties so as to make it easier to produce the components. For example, if $S_1$ is made of lithium niobate or lithium tantalate, $S_2$ will preferably be made of fused silica or single-crystal silicon;

the two substrates are both piezoelectric, but of different nature. For example, the following combinations may be mentioned:

quartz/lithium niobate quartz/lithium tantalate lithium tantalate/lithium niobate;

the two substrates are of the same nature but of different crystal cut. FIG. 2 shows, using the IEEE 1949 conventions in the initial orthonormal coordinate system (X,Y,Z), Z being parallel to the optical axis of the crystal, X being defined by the piezoelectricity of the crystal and Y being perpendicular to (X,Z), the geometrical representation of the cut plane being defined by two successive rotation angles ϕ and θ. Here, ϕ corresponds to a first rotation about the Z axis, the coordinate system obtained thus being denoted by (X',Y',Z') with Z' coincident with Z, and θ corresponds to a second rotation about the X' axis, the coordinate system obtained thus being denoted by (X",Y",Z"), with Z' coincident with X'. In this final coordinate system, the direction of propagation of the acoustic waves is then defined by a third angle ψ representing a rotation about the Y" axis. As an example, with these conventions, the values of the angles for the cuts normally used in surface waves for ST quartz are the following:

ϕ=0°; θ=42.75°; ψ=0°; and finally the two substrates may be of the same nature and same cut. For example, it is possible to use quartz and lithium niobate or lithium tantalate. In this case, as a general rule the assembly operation will be carried out with the same crystal orientation of the two substrates.

The latter case is particularly interesting in so far as the problems of compatibility between the substrates $S_1$ and $S_2$, in particular the thermal expansion and assembly problems, are implicitly solved. In this case, the orientations of the crystal faces are chosen so as to obtain polarizations of the same direction.

Four major characteristics define the acoustic wave propagation properties of piezoelectric materials. These are:

the velocity V of propagation of the interface acoustic wave. This parameter is important in so far as, for a given operating frequency F, it determines the pitch P of the array of teeth of the electrode combs which is proportional to V/F. When one works at high frequency, typically of the order of a few GHz, achieving high velocities makes it possible to maintain sufficiently wide pitches compatible with current etching technologies;

the attenuation A or insertion loss, expressed in dB per acoustic wavelength, a parameter that it is desired, in general, to reduce so as to reduce the insertion losses of the device;

the first-order coefficient CFT of the variation in frequency as a function of temperature near the ambient temperature, expressed in ppm.$C^{-1}$. The configuration of the device will be less sensitive to thermal variations the lower this coefficient; and the electromechanical coupling coefficient k2 representative of the maximum relative frequency band that can be obtained with a device, this coefficient being calculated as the relative half-difference between the velocities of the surface waves on the free substrate and the metalized substrate. In general, this coefficient is the parameter that it is desired to maximize, k2 being a dimensionless parameter expressed as a percent.

These various parameters, and in particular the coupling coefficient k2, depend strongly on the cut angle of the piezoelectric crystal and on the direction of propagation. It is thus possible to obtain, depending on the cut angle in the case of lithium tantalate, k2 values varying between 0 and 7 as indicated in FIGS. 3a and 3b. FIG. 3a shows the variation of k as a function of (ϕ,ψ) at zero θ and FIG. 3b shows the variation of k2 as a function of (θ,ψ) at zero ϕ. In these figures, the discontinuities show the regions within which no possible propagation mode exists. The choice of the cut angle is therefore fundamental. However, the variations in the acoustic characteristics as a function of this angle cannot be determined simply, for example by considerations regarding the crystal structure. They are also very different from those that are obtained in the case of free materials used for the surface acoustic waves.

U.S. Pat. No. 2,799,906 (Pierre Tournois) relating to the production of interface acoustic wave filters gives general recommendations mentioned by way of example and allowing optimum cut angles to be chosen. Particularly mentioned in the case of the use of lithium tantalate that the cuts may be taken along the Y crystallographic axis (where Y is rotated through a certain angle, for example 175°).

SUMMARY OF THE INVENTION

The invention itself proposes a selection of optimized cut angle ranges. In fact it gives precisely the tolerances on the cut angles, the set of optimum cut angles making it possible to obtain, in the case of lithium tantalate, the best possible characteristics, in particular the highest values of the parameter k2, and finally the values of the main characteristics for achieving the expected performance characteristics.

The various steps in producing the components are also described.

Within this context, the subject of the invention is an interface acoustic wave device comprising:

a first crystal substrate made of lithium tantalate ($LiTaO_3$);

a second crystal substrate, also made of lithium tantalate;

these being joined together via a plane interface region serving for the propagation of acoustic waves and comprising at least the electroacoustic transducers;

interconnection means for electrically connecting said transducers;

the substrates, referenced in an initial orthonormal coordinate system (X,Y,Z), Z being parallel to the optical axis, X being defined by the piezoelectricity of the crystal and Y being perpendicular to (X,Z), having their identical cut plane and a common crystal orientation, said cut plane being identified by two successive angles of rotation ϕ and θ, ϕ corresponding to a first rotation about the Z axis, the coordinate system obtained thus being denoted by (X',Y',Z') with Z' coincident with Z, and θ representing a second rotation about the X' axis, the coordinate system obtained thus being denoted by (X",Y",Z"), with X" coincident with X', the direction of propagation of the acoustic waves being defined by a third angle ψ taken in said coordinate system (X",Y",Z") representing a rotation about the Y" axis, characterized in that, for any direction of propagation ψ:

the angles (ϕ,θ) lie within one of the following two angular ranges called the $(0,0,0)_a$ cut and the $(60,0,0)_a$ cut:

$(0,0,0)_a$ cut:
$$-5° \leq \phi \leq +5°$$
$$-20° \leq \theta \leq +30°$$
$(60,0,0)_a$ cut:
$$+55° \leq \phi \leq +65°$$
$$-30° \leq \theta \leq +20°.$$

Advantageously, so as to obtain the maximum values of the coupling coefficient and to reduce the insertion losses, it is preferable to work within restricted angular ranges. In this case, the angles $(\phi,\theta,\psi)$, taken within the $(X'',Y'',Z'')$ coordinate system lie within one of the following two angular ranges called the $(0,0,0)_b$ cut and the $(60,0,0)_b$ cut:

$(0,0,0)_b$ cut:
$$-5° \leq \phi \leq +5°$$
$$-10° \leq \theta \leq +10°$$
$$-5° \leq \psi \leq +5°$$
$(60,0,0)_b$ cut:
$$+55° \leq \phi \leq +65°$$
$$-10° \leq \theta \leq +10°$$
$$-5 \leq \psi \leq +5°.$$

Advantageously, the thicknesses of the two substrates are large compared with the operating acoustic wavelength ($\lambda$). Under these conditions, the acoustic waves remain confined within the two substrates, thereby preventing any possible perturbation from the outside. In contrast, the thickness of the interface region is chosen to be small compared to the same operating acoustic wavelength so that the perturbations introduced by the intrinsic mechanical properties of said region are negligible.

Advantageously, the interface region is in the form of a laminated structure comprising at least the electroacoustic transducers and one or more layers of dielectric material. The main advantages of these layers are that they promote either the propagation of the waves or the adhesion of the second substrate to the interface region.

Advantageously, the interface region comprises only the electroacoustic transducers, which are then etched on one of the two surfaces of the substrates in contact with each other, said interface region then being reduced to an interface plane. Under these conditions, the combination of the two substrates and of the interface region once assembled is equivalent to a single substrate within which the transducers are found.

Advantageously, the device may be used for all applications accessible to surface acoustic wave devices, especially as a passive compon ent such as a resonator or a filter or a delay line or a phase code device.

Finally, it is possible to use it either in a measurement chain or in an array of devices operating according to the principle of coded devices, such as a remotely interrogable device.

BRIEF DESCRIPTION OF THE DRAWING

The invention will be more clearly understood and other advantages will become apparent on reading the description that follows, which is given by way of nonlimiting example, together with the appended figures in which.

DETAILED DESCRIPTION OF THE INVENTION

Figure 1:
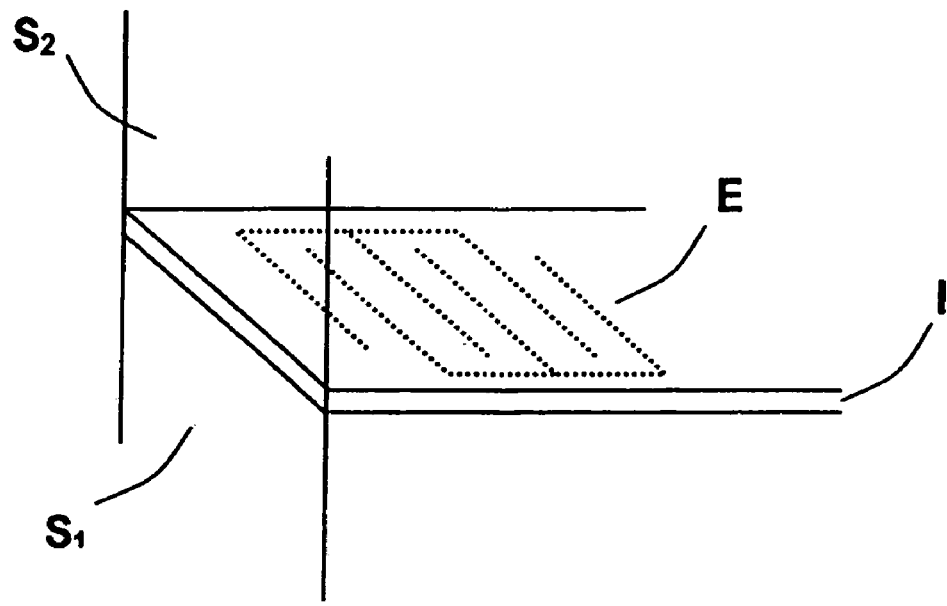
FIG. 1 gives the general configuration of an interface wave device shown in a schematic manner.
Figure 2:
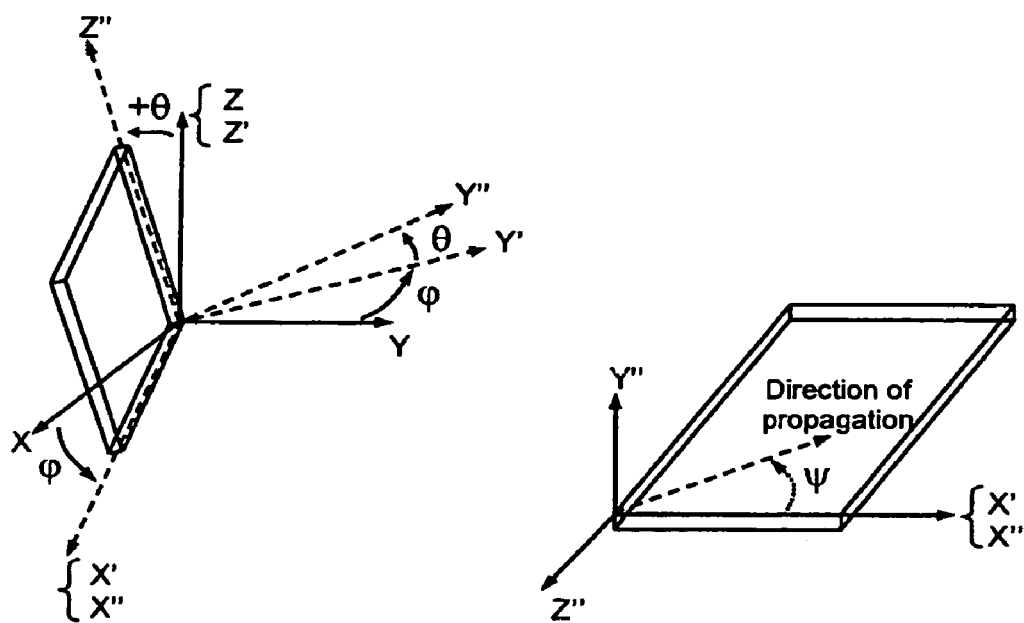
FIG. 2 gives the geometrical representation of the cut angle defined by the angles $\phi$ and $\theta$ and the representation of the direction of propagation in the coordinate system of the cut angle.
Figure 3A:
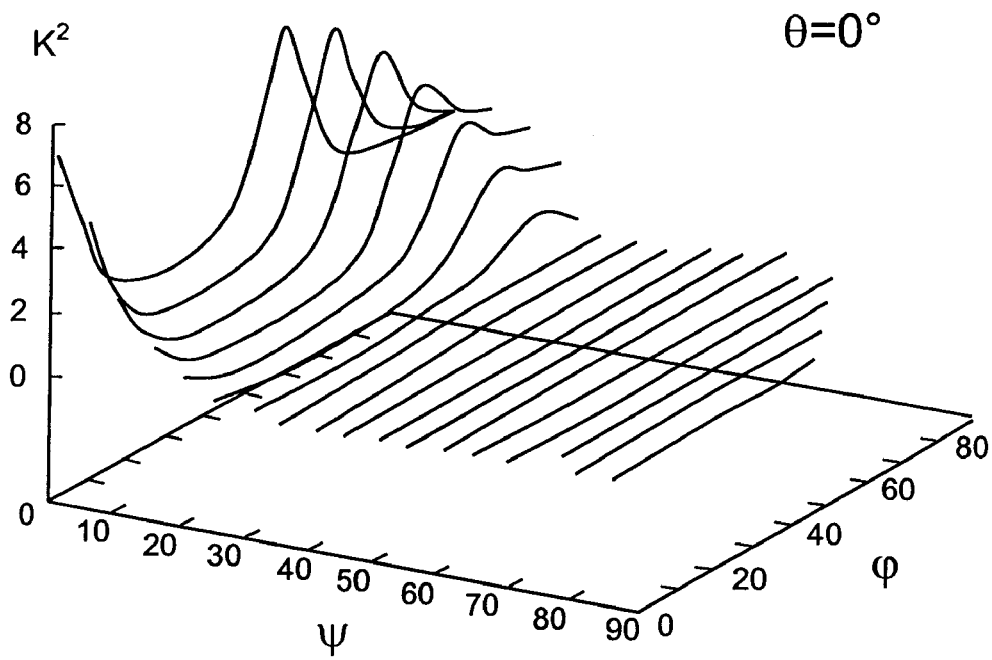
FIGS. 3a and 3b give the variations of k2 as a function of the cut angle and of the direction of propagation for lithium tantalate in the following two configurations: zero $\theta$ and zero $\phi$.
Figure 3B:
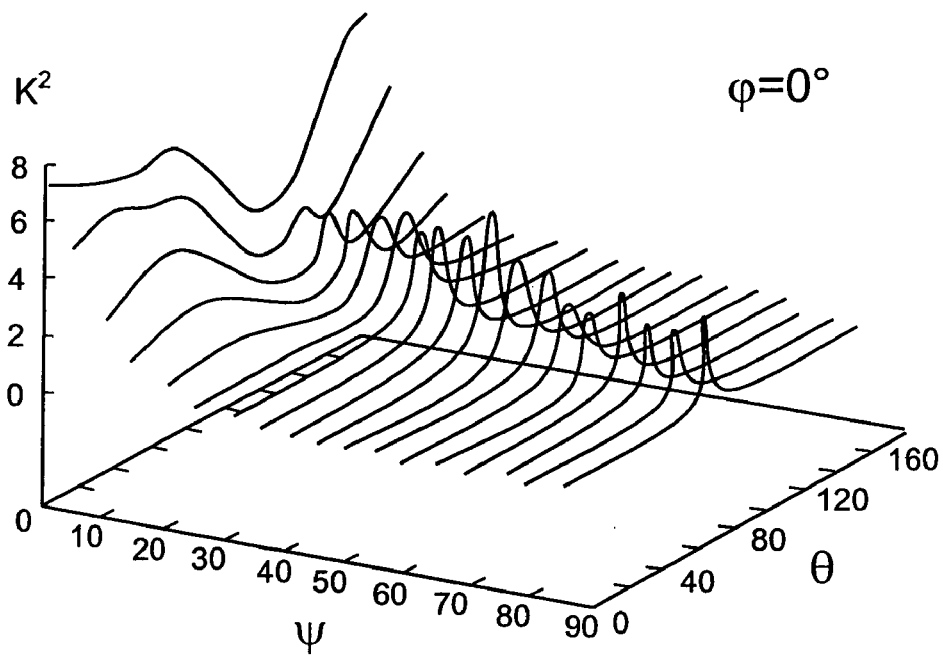
Figure 4A:
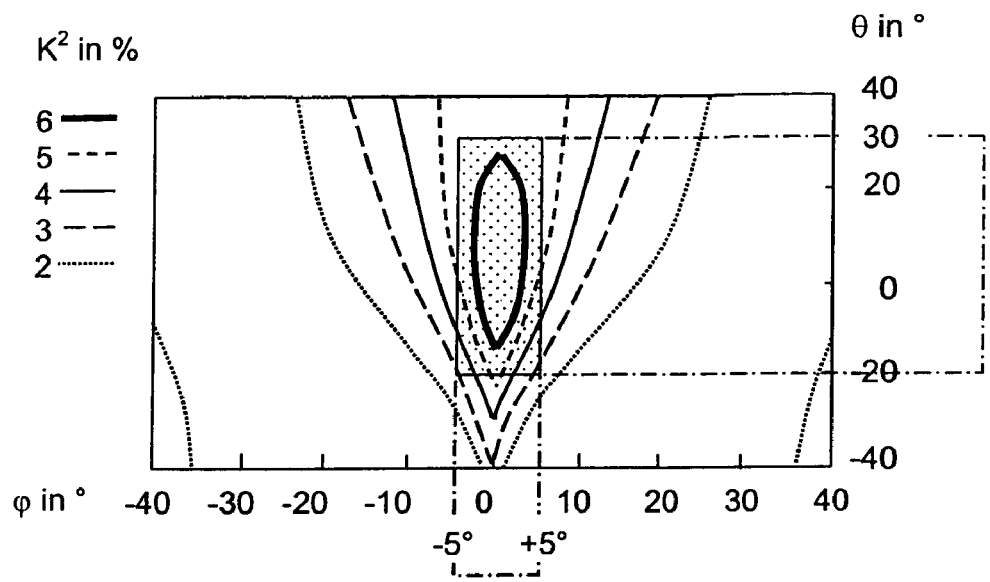
FIGS. 4a and 4b give the map of the variations of the coupling coefficient k2 and of the insertion losses as a function of the variations in $\theta$ and $\phi$ for the $(0,0,0)_a$ cut at zero $\psi$.
Figure 4B:
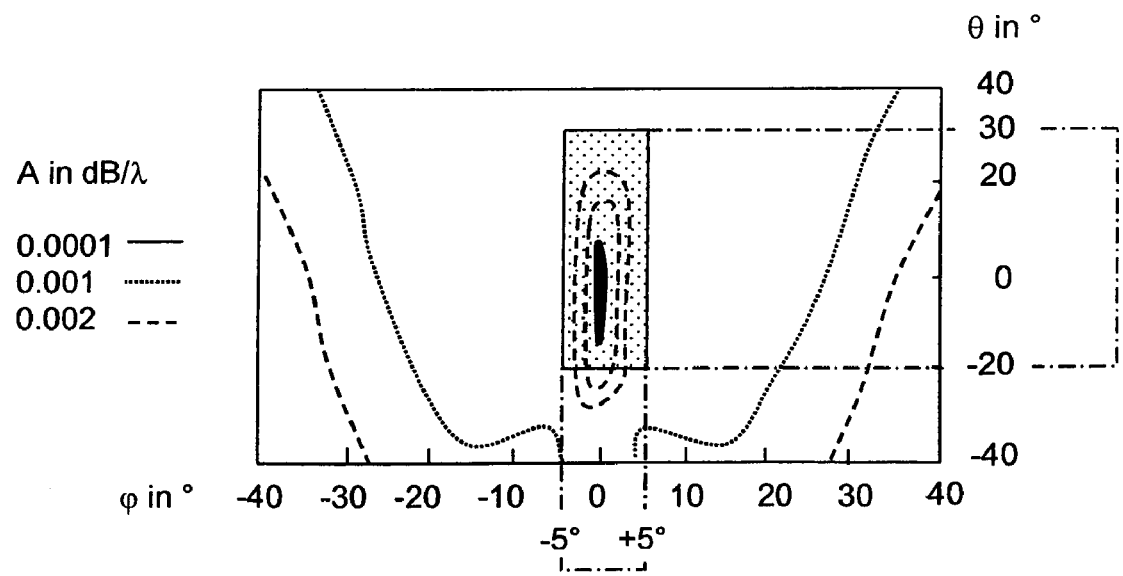
Figure 5A:
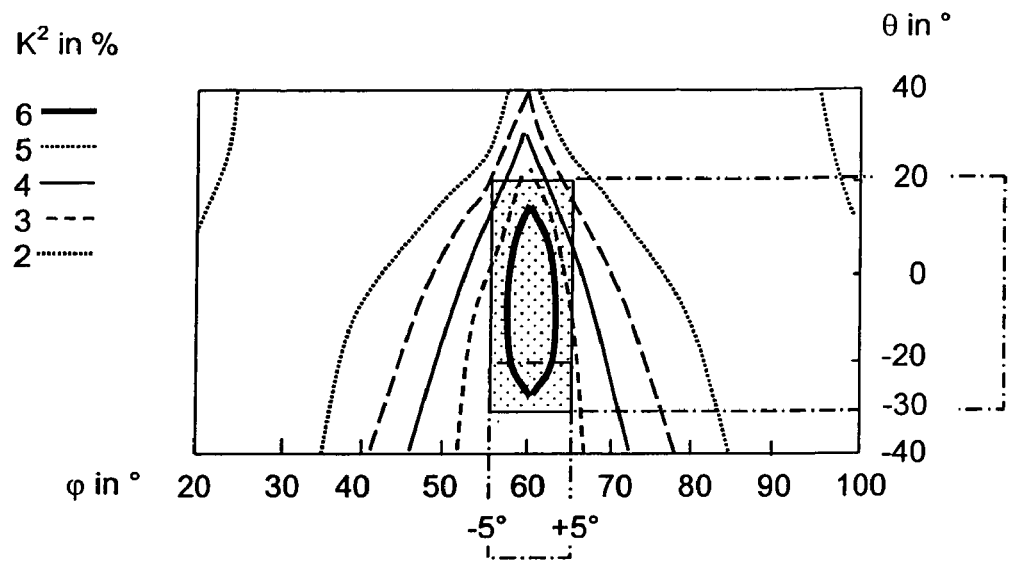
FIGS. 5a and 5b give the map of the variations of the coupling coefficient k2 and of the insertion losses as a function of the variations of $\theta$ and $\phi$ for the (60,0,0) a cut at zero $\psi$.
Figure 5B:
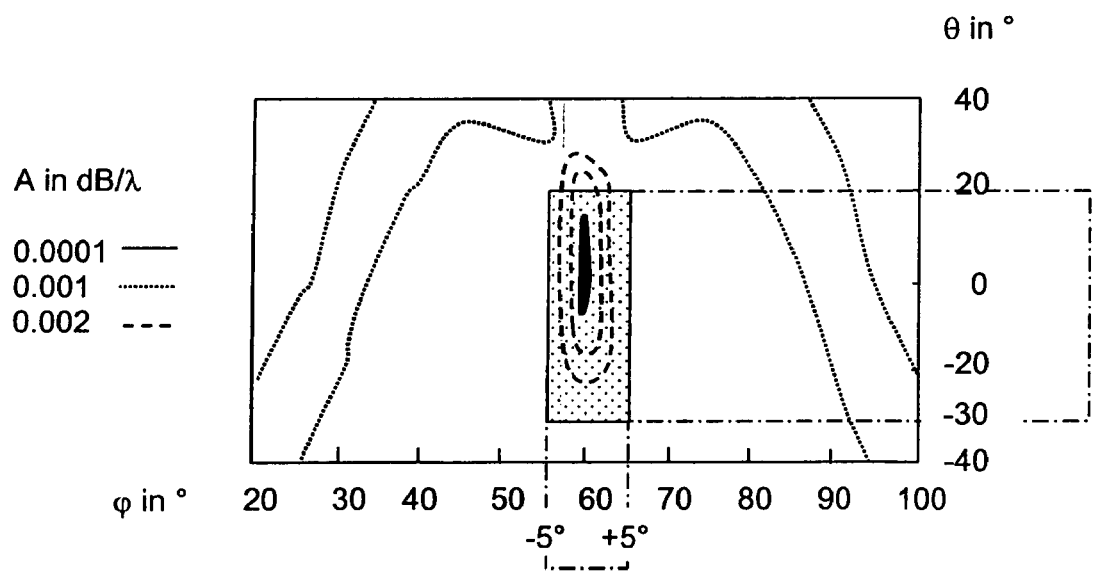

To obtain good coupling coefficients k2, typically greater than 3%, and low attenuations for all directions of propagation of the waves in the plane of the interface, the cut angles $(\phi,\theta)$ fall within the following angular ranges called the $(0,0,0)_a$ cut and the $(60,0,0)_a$ cut (FIGS. 4a, 4b, 5a and 5c):

$(0,0,0)_a$ cut:
$$-5 \leq \phi \leq +5°$$
$$-20° \leq \theta \leq +30°;$$
$(60,0,0)_a$ cut:
$$+55° \leq \phi \leq +65°$$
$$-30° \leq \theta \leq +20°.$$

To obtain optimized coupling coefficient k2 typically greater than 6% and low attenuations, typically less than $2\times10^{-3}$, the cut angles $(\phi,\theta)$ and the direction of propagation $\psi$ fall within the following ranges called the $(0,0,0)_b$ cut and the $(60,0,0)_b$ cut (FIGS. 4a, 4b, 5a and 5c):

$(0,0,0)_b$ cut:
$$-5° \leq \phi \leq +5°$$
$$-10° \leq \theta \leq +10°$$
$$-5° \leq \psi \leq +5°$$
$(60,0,0)_b$ cut:
$$+55° \leq \phi \leq +65°$$
$$-10° \leq \theta \leq +10°$$
$$-5° \leq \psi \leq +5°$$

The table below gives, for each range, the cut angle in the coordinates $(\phi,\theta,\psi)$ allowing the maximum value of the coupling coefficient k2 to be obtained. The values of the four main parameters are given for this angle.

| | Orientation ($\phi$, $\theta$, $\psi$) | Maximum k2 in % | Velocity in ms$^{-1}$ | Attenuation in dB$\lambda^{-1}$ | CFT in ppmC$^{-1}$ |
|---|---|---|---|---|---|
| Range 1 | (0, 0, 0) | 6.8 | 4073 | $-3 \times 10^{-6}$ | $-22$ |
| Range 2 | (60, 0, 0) | 6.7 | 4073 | $-3 \times 10^{-6}$ | $-41$ |

Figure 6A:
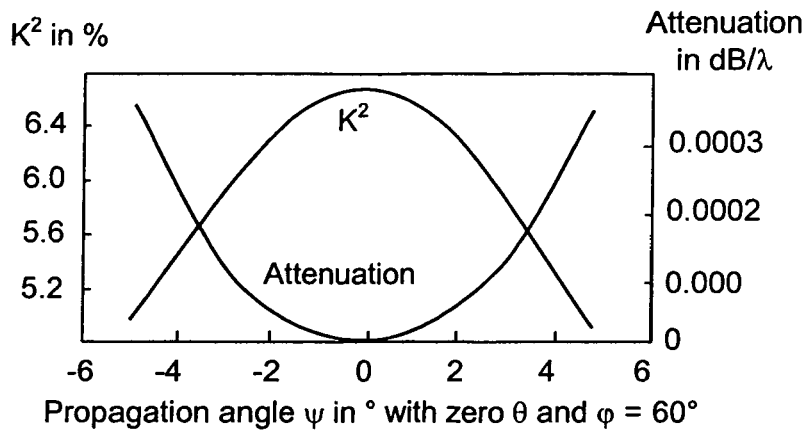
FIGS. 6a, 6b and 6c give the variations of the coupling coefficient k2 and of the insertion losses near the $(0,0,0)_a$ cut as a function of the variations of one of the three angles $\theta$, $\phi$ and $\psi$, the other two angles being chosen to be constant.
Figure 6B:
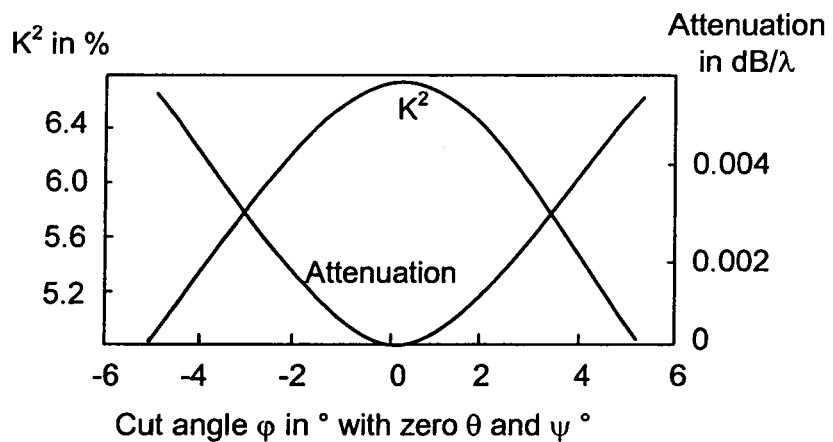
Figure 6C:
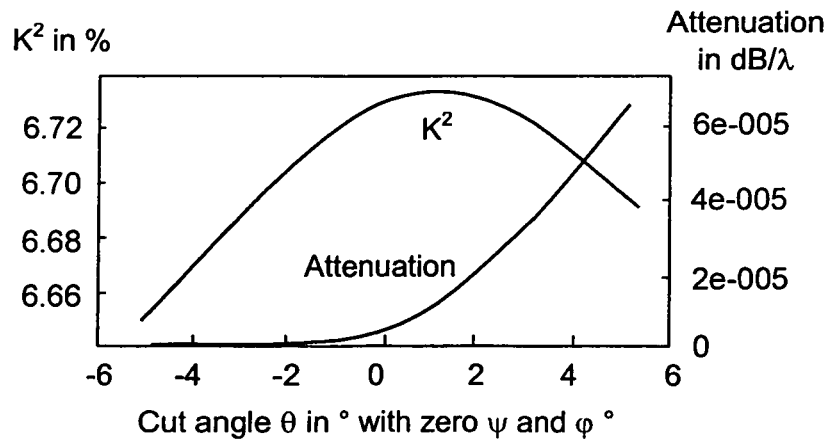
Figure 7A:
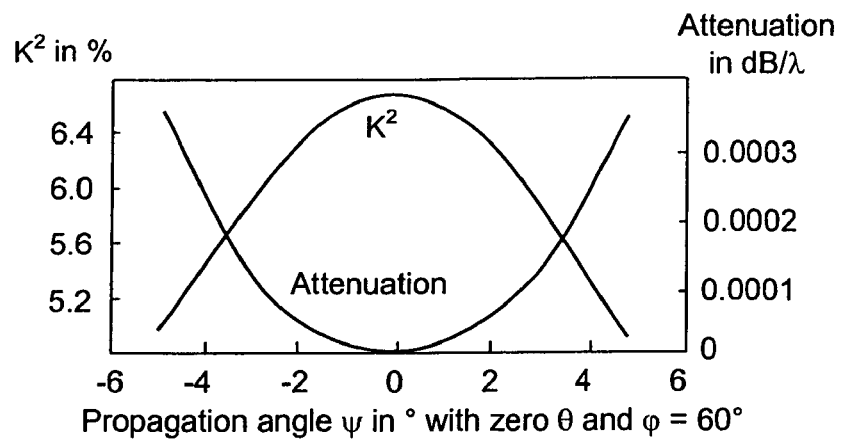
FIGS. 7a, 7b and 7c give the variations of the coupling coefficient k2 and of the insertion losses near the $(60,0,0)_a$ cut as a function of the variations of one of the three angles $\theta$, $\phi$ and $\psi$, the other two angles being chosen to be constant.
Figure 7B:
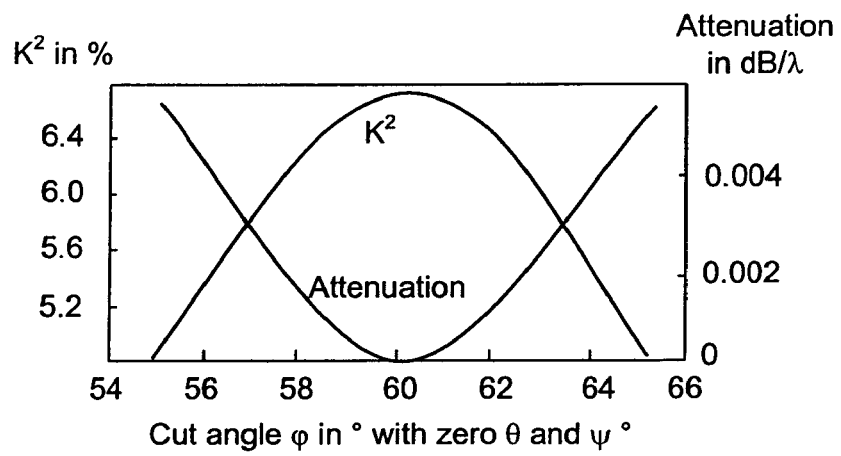
Figure 7C:
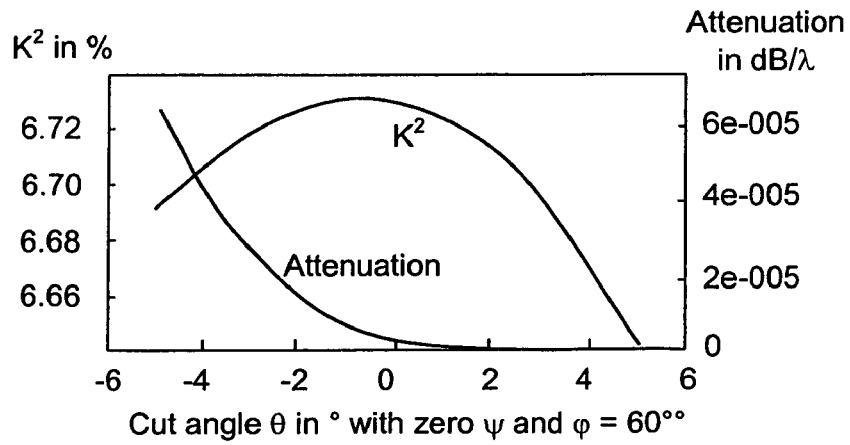

The variations of k2 about these maximum values are illustrated in FIGS. 6a to 7c.

The production of an interface wave component made of lithium tantalate comprises the following steps:

production of the interface region on one of the two substrates, this production necessarily including the substep of producing the electrode combs;

assembly and cutting of the two substrates; and production of the electrical interconnections.

The electrode combs are produced either by what is called a buried-electrode process or what is called a deposited-electrode process.

In the first case, the main steps of the process are:

production of a plane cut of the first lithium tantalate substrate at the cut angle adopted;

etching of the locations of the electrodes;

deposition of the material intended to produce the electrodes, which may be made of pure aluminum or an aluminum alloy for limiting thermal migration, such as copper-titanium; and finally planarization so as to leave the material only at the locations of the etching.

In the second case, the main steps of the process are:

deposition on the plane substrate of the material intended to produce the electrodes;

then cutting of this material in order to leave just the electrodes;

deposition of an insert layer C between the electrodes; and surfacing of the layer C so as to obtain a plane layer with the thickness of the electrodes.

In an alternative embodiment, the process may start by depositing the layer C, producing, in this layer, openings at the locations of the electrodes, depositing the material of the electrodes on this layer and, finally, leveling-off so as to obtain the previous result. If the thickness of the layer is small enough compared with the acoustic wavelength, the electroacoustic characteristics of the assembly are only barely modified.

Additional layers of dielectric material may then be added for technological or acoustic reasons in order to complete the interface region. These layers may especially promote the bonding between the two substrates. However, the final thickness of I must remain small compared with the operating acoustic wavelength if it is desired to preserve the properties due to the cut angles of the substrates.

The second substrate, which was also cut in lithium tantalate at the same cut angle as the first substrate, is then attached to the substrate at the end of the electrode fabrication process. This assembly may be carried out either by molecular bonding or by anodic bonding. Geometrically, the second substrate has the crystal orientation as the first.

Next, the electrical interconnections are produced. There are several possible implantations. Mention may be made, by way of nonlimiting examples, of:

production of the interconnection in the plane of the interface region;

production of the interconnection through one of the two substrates.

The invention claimed is:

1. An interface acoustic wave device, comprising:

a first crystal substrate ($S_1$) made of lithium tantalate ($LiTaO_3$);

a second crystal substrate ($S_2$), also made of lithium tantalate;

said first and second crystal substrates being joined together via a plane interface region (I) serving for the propagation of acoustic waves and comprising at least one electroacoustic transducer;

interconnection means for electrically connecting said transducers; the substrates, referenced in an initial orthonormal coordinate system (X,Y,Z), Z being parallel to the optical axis, X being defined by the piezoelectricity of the crystal and Y being perpendicular to (X,Z), having their identical cut plane and a common crystal orientation, said cut plane being identified by two successive angles of rotation $\phi$ and $\theta$, $\phi$ corresponding to a first rotation about the Z axis, the coordinate system obtained thus being denoted by (X',Y',Z') with Z' coincident with Z, and $\theta$ representing a second rotation about the X' axis, the coordinate system obtained thus being denoted by (X",Y",Z"), with X" coincident with X', the direction of propagation of the acoustic waves being defined by a third angle $\psi$ taken in said coordinate system (X",Y",Z") representing a rotation about the Y" axis, characterized in that, for any direction of propagation $\psi$:

the cut angles ($\phi,\theta$) lie within one of the following two angular ranges called the $(0,0,0,)_a$ cut and the $(60,0,0)_a$:

$$-(0, 0, 0)_a \text{ cut:} -5° \leq \varphi \leq +5° -20° \leq \theta \leq +30°$$

$$-(60, 0, 0)_a \text{ cut:} +55° \leq \varphi \leq +65° -30° \leq \theta \leq +20°.$$

2. The acoustic wave device as claimed in claim 1, in that the angles ($\phi,\theta,\psi$), taken within the (X",Y",Z") coordinate system lie within one of the following two angular ranges called the $(0,0,0,)_b$ cut and the $(60,0,0)_b$ cut:

$$-(0, 0, 0)_b \text{ cut:} -5° \leq \varphi \leq +5° -10° \leq \theta \leq +10° -5° \leq \psi \leq +5°$$

$$-(60, 0, 0)_b \text{ cut:} +55° \leq \varphi \leq +65° -10° \leq \theta \leq +10° -5° \leq \psi \leq +5°.$$

3. The device as claimed in claim 1, in that the thicknesses of the two substrates are large compared with the operating acoustic wavelength ($\lambda$) and the thickness of the interface region is small compared with the operating acoustic wavelength ($\lambda$).

4. The device as claimed in claim 1, in that the interface region is in the form of a laminated structure comprising at least one electroacoustic transducers and one or more layers of dielectric material.

5. The device as claimed in claim 1 in that the interface region comprises only one electroacoustic transducers, which are then etched on one of the two surfaces of the substrates in contact with each other, said interface region then being reduced to an interface plane.

6. The device as claimed in claim 1 in that said device is a passive component such as a resonator or a filter or a delay line or a phase code device.

7. A measurement sensor composed of a chain of devices, wherein said chain comprises at least one device as claimed in claim 1.

8. A device operating according to the phase code principle and composed of a chain of devices, characterized in that said chain comprises at least one device as claimed in claim 1.

* * * * *